United States Patent [19]
Gabara

[11] Patent Number: 5,708,389
[45] Date of Patent: Jan. 13, 1998

[54] INTEGRATED CIRCUIT EMPLOYING QUANTIZED FEEDBACK

[75] Inventor: Thaddeus John Gabara, Murray Hill, N.J.

[73] Assignee: Lucent Technologies Inc., Murray Hill, N.J.

[21] Appl. No.: 615,561

[22] Filed: Mar. 15, 1996

[51] Int. Cl.$^6$ ................ H03K 5/00; H03K 5/08
[52] U.S. Cl. .......... 327/552; 327/312; 327/306; 327/317; 327/551; 327/558; 327/24; 327/559
[58] Field of Search ................ 327/306, 312, 327/317, 551, 552, 362, 363, 165, 166, 218, 331, 332, 333, 558, 24, 559

[56] References Cited

U.S. PATENT DOCUMENTS

| | | | |
|---|---|---|---|
| 3,815,033 | 6/1974 | Tewksbury | 329/104 |
| 4,859,883 | 8/1989 | Badinal | 327/312 |
| 5,483,552 | 1/1996 | Shimazaki et al. | 375/233 |

FOREIGN PATENT DOCUMENTS

| | | | |
|---|---|---|---|
| 5308245 | 11/1993 | Japan | 327/559 |

OTHER PUBLICATIONS

D. Salzman, et al. "Capacitive Coupling Solves the Known Good Die Problem" *IEEE Multi–Chip Module Conference*, MCMC–94, Santa Cruz, CA, pp. 95–99 (Mar. 15–17, 1994).

D. Dalzman, et al. "Application of Capacitive Coupling to Switch Fabrics" *IEEE Multi–Chip Module Conference*, MCMC–95, Santa Cruz, CA, pp. 195–199, (Jan. 31, 1995).

W. R. Bennett, "Synthesis Of Active Networks" Presented at the Symposium On Modern Network Synthesis, Polytechnic Institute of Brooklyn, pp. 45–61, (Apr. 13–15, 1955).

*Primary Examiner*—Timothy P. Callahan
*Assistant Examiner*—Dinh T. Le
*Attorney, Agent, or Firm*—Robert E. Rudnick

[57] ABSTRACT

An integrated circuit employing quantized feedback is capable of compensating for decay in capacitively-coupled digital signals. In an exemplary embodiment, the integrated circuit includes a quantized feedback receiver connected to a capacitively-coupled integrated circuit input. The capacitively-coupled input produces a decaying signal for corresponding intervals of an input digital signal that are substantially DC voltages. Longer sequences of consecutive data bits of the same logic state in the input signal are represented by a corresponding longer DC voltage signals resulting in a greater decay in the capacitively-coupled signal. The receiver operates by generating a complementary feedback signal which is combined with the capacitively-coupled signal. The feedback signal is generated with a magnitude rate of change that compensates for the decay in the capacitively-coupled signal such that the digital information in the combined signal can be detected substantially without error due to the decay.

12 Claims, 2 Drawing Sheets

INTEGRATED CIRCUIT EMPLOYING QUANTIZED FEEDBACK

FIELD OF THE INVENTION

The invention relates to integrated circuit communications in general and more particularly to the use of quantized feedback in an integrated circuit.

BACKGROUND OF THE INVENTION

In conventional digital communications systems, it is often advantageous for integrated circuit chips that use different and incompatible operating voltages to communicate with one another. For example, it is often desirable to have an emitter coupled logic (ECL) integrated circuit employing −1.75 V and −0.9 V for logic states to communicate with a complimentary metal oxide semiconductor (CMOS) integrated circuit employing 0 and 5 V for its logic states. To achieve such inter-chip communication, capacitive coupling has been used to block intervals of DC voltages in a transmitted communication signal.

A typical communication signal conveys digital information using a sequence of segments of fixed duration, with each segment representing a respective data bit of the digital information. Each segment possesses a particular DC voltage level for representing the particular binary logic state of the corresponding data bit. Accordingly, the communications signal includes DC voltage intervals representing each data bit in the sequence and AC voltage intervals for the rise and fall times of the voltage transitions that occur between consecutive bits of different logic states.

Capacitive coupling conveys the AC intervals corresponding to voltage transitions in the communication signal to an input of a receiving integrated circuit while blocking the voltage magnitude of the DC intervals. Accordingly, capacitive coupling can prevent erroneous reading of the digital information conveyed in a communication signal by those receiving integrated circuits that employ different operating voltages for logic states. However, a conventional coupling capacitor disadvantageously acts in combination with an input resistance of the receiving integrated circuit to produce a high pass filter. This high pass filter causes the capacitively-coupled signal at the input of the receiving integrated circuit to exponentially decay during the DC intervals of the communication signal.

More specifically, at the start of the DC interval, the capacitively-coupled signal has an initial voltage magnitude that is equal to the voltage magnitude achieved at the last voltage transition in the communication signal. After starting at such a magnitude, the signal then decays for the remainder of the interval until the next voltage transition is received in the communication signal. The transient rate of decay of the capacitively-coupled signal is based on the RC time constant of the produced high pass filter. Longer sequences of consecutive data bits of the same logic state in the communication signal produce greater decay in the corresponding capacitively-coupled signal. If the signal decays to a voltage level below the receiving integrated circuit's threshold voltage for detecting a logic state transition, then an erroneous reading of the transmitted data would result.

In order to minimize the decay of capacitively-coupled signals, larger coupling capacitors with larger capacitance's are often employed to increase the RC time constant of the high pass filter. The increased RC time constant produces a relatively slower decay rate enabling larger sequences of consecutive data bits of the same logic state to be detected without error. However, the typically required increase in capacitance, often on the order of 0.1 μF, requires a relatively large surface mount capacitor that uses valuable surface area of a printed wiring board. Moreover, the larger capacitors are too large to be formed on the corresponding transmitting or receiving integrated circuits using conventional fabrication techniques. As a consequence, the number of capacitively-coupled input-output connections that can be used within integrated circuit is reduced.

In addition, transmitted signals are often encoded to reduce the possibility of large sequences of consecutive data bits of the same logic state and the extent of the decay of the capacitively-coupled signal. However, such encoding and corresponding decoding adds undesirable complexity and expense to the integrated circuit design.

Thus, a need exists for an enhanced integrated circuit capacitive coupling technique that does not require large capacitors and/or encoding.

SUMMARY OF THE INVENTION

The invention is based on the novel and unobvious application of quantized feedback to substantially reduce the transient decaying effects produced by capacitive coupling integrated circuits. As used herein, "quantized feedback" refers to the generation of a complimentary feedback signal having a magnitude with a rate of change that compensates for the transient decay rate of a capacitively-coupled signal when these signals are combined. Such compensation should be sufficient to reduce errors in detecting the logic states of the digital information conveyed in the communication signal. It is possible to substantially eliminate such errors by generating the feedback signal with a magnitude rate of change substantially equal to the transient decay rate of the capacitively coupled signal.

A quantized feedback technique was originally employed in regenerative repeaters in undersea cables for processing communication signals effected by typical interference experienced over long distances of undersea telephone cables. Although quantized feedback was used to reduce the effects of interference over long distances in such cables, it has a novel and unobvious application in substantially correcting the signal decay of communication signals between capacitively-coupled integrated circuits.

Accordingly, a quantized feedback receiver is employed in an integrated circuit to generate the complementary feedback signal and combine it with a capacitively-coupled signal. The resulting combined signal substantially compensates for the decaying intervals in the received signals and restores such intervals to voltage magnitudes detectable by the integrated circuit. The digital information in the resulting combined signal can then be detected by other sections of the integrated circuit or other integrated circuits substantially without error.

The invention enables integrated circuits to employ capacitive coupling to receive communication signals substantially independent of the respective DC voltage magnitudes used to represent logic states and substantially free of the decay typically associated with such coupling. As a consequence, sequences of consecutive data bits of the same logic state in a communication signal do not produce an erroneous data reading. Thus, encoding and decoding of the communication signal for this purpose is not required which results in an advantageous reduction in circuit complexity and power requirements.

This invention is particularly useful in providing interconnection of different integrated circuit types including different standard types of integrated circuits, such as CMOS, ECL, transistor-transistor-logic (TTL), Gunning-transceiver-logic (GTL), low-voltage-differential-swing (LVDS), pseudo-emitter-coupled logic (PECL) and high-speed-transceiver-logic (HSTL), without the need for elaborate and complex conversion techniques and hardware. With the increasing number of input/output standards being developed, the invention enables a single integrated circuit receiver to detect digital information conveyed in signals according to such new standards without requiring a redesign or reconfiguration of the integrated circuit.

Additional features and advantages of the present invention will become more readily apparent from the following detailed description and accompanying drawings.

DETAILED DESCRIPTION

The invention is based on the discovery that quantized feedback can be employed to compensate for the decaying intervals of a capacitively-coupled input signal caused by high pass filtering at an integrated circuit input. Thus, an integrated circuit in accordance with the invention employs a quantized feedback receiver (QFR) to generate a complimentary feedback signal having a magnitude that changes at a particular rate to compensate for the transient decay of such intervals in the input signal when the signals are combined. Sufficient compensation should be provided by the feedback signal to reduce erroneous detection of the logic states of the digital information conveyed in the input signal before it is provided to other sections of the integrated circuit or routed to other integrated circuits.

Several exemplary configurations of the invention are described in detail below with regard to FIGS. 1 and 3. These configurations are for illustration purposes only and not meant to be a limitation of the invention. It is possible to employ numerous other QFR configurations to produce the desired complimentary signal for eliminating the transient decay in a capacitively-coupled signal in accordance with the invention.

Figure 1:
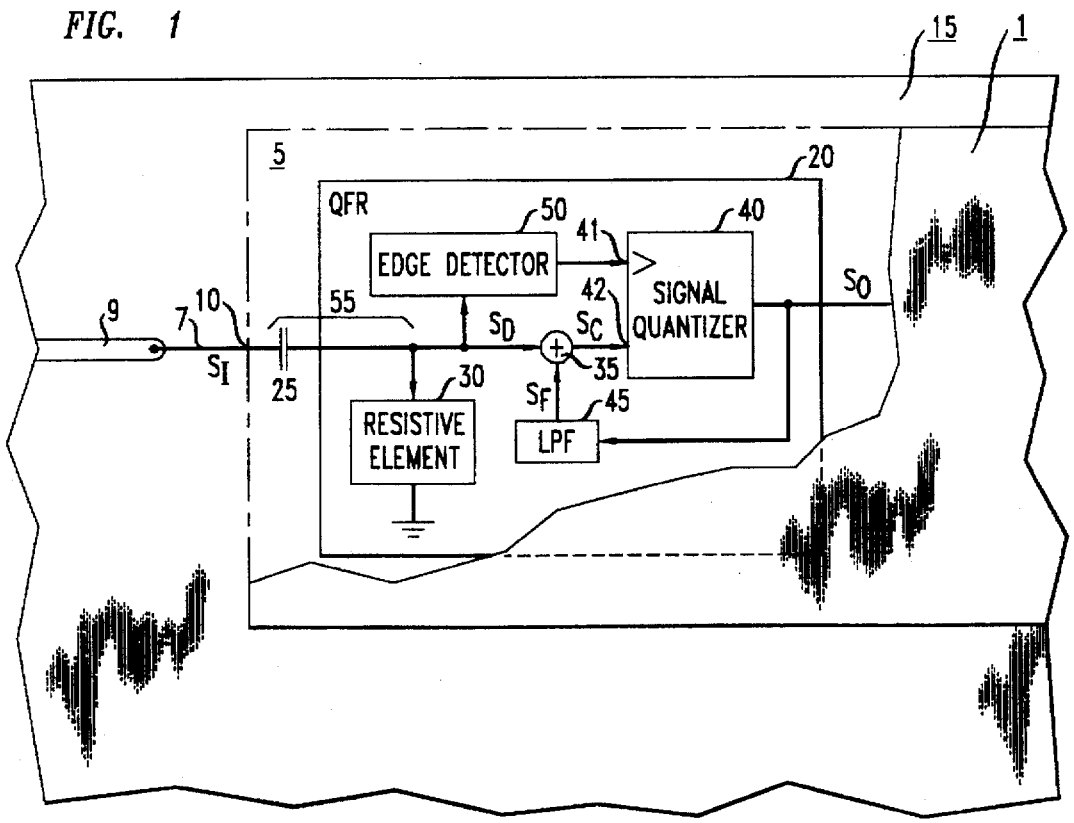
FIG. 1 illustrates a schematic block diagram of an exemplary input section of an integrated circuit chip in accordance with the invention.

FIG. 1 illustrates an exemplary input section 5 of an integrated circuit 1 in accordance with the invention. The input section 5 has an input 10 capacitively-coupled by interconnect 7 to an assembly 15, such as a printed wiring board (PWB) or multi-chip module (MCM) forming an electrical circuit. More specifically, the interconnect 7 is coupled to an electrical interconnect 9, such as a metalized trace wire on the assembly 15. The interconnects 7 and 9 provide electrical communication between the integrated circuit 1 and other integrated circuits or electrical components (not shown) that are coupled to the assembly 15. An input signal $S_I$ is provided from the assembly 15 through the interconnects 7 and 9 to the integrated circuit input 10.

The integrated circuit input section 5 includes a capacitor 25 that provides the capacitive coupling for the input 10. A QFR 20 is coupled to the input 10 via the capacitor 25.

Although the coupling capacitor 25 is located on the integrated circuit 1 in FIG. 1, it is also possible to form the capacitively-coupled input 10 with the capacitor 25 positioned on the assembly 15, as pan of the interconnect 7 or within a protective package (not shown) that encompasses the integrated circuit 1.

Moreover, the depicted input section 5 includes a single capacitively-coupled input 10 and corresponding QFR 20 for ease of illustration and discussion purposes only and is not meant to be a limitation of the invention. It is further possible for an integrated circuit in accordance with the invention to employ a plurality of capacitively-coupled inputs and QFRs as is required by the integrated circuit application.

The QFR 20 includes an electrically resistive element 30 such as a resistor, a signal combiner 35, a signal quantizer 40 and a low pass filter (LPF) 45. The capacitor 25 is coupled to the resistive element 30 which is also coupled to an AC ground of the integrated circuit 1. The resistive element 30 and capacitor 25 are further coupled to the signal combiner 35. The capacitor 25 and resistive element 30 form a high pass filter 55 that produces a capacitively-coupled signal $S_D$ based on the input signal $S_I$. The signal $S_D$ is provided to the signal combiner 35. The signal combiner 35 also receives a complimentary feedback signal $S_F$ and generates a combined signal $S_C$ corresponding to a restored capacitively-coupled signal which is provided to an input 42 of the signal quantizer 40.

The signal quantizer 40 generates an output signal $S_O$ which can be provided to another section of the integrated circuit 1 or to another integrated circuit (not shown) for processing. Although either signals $S_C$ or $S_O$ can be used to convey the digital information to the another integrated circuit section or integrated circuit, it is desirable to use the signal $S_O$ for such a purpose as described in detail below with regard to FIG. 2. The output signal $S_O$ is also provided to the LPF 45 which produces the complimentary feedback signal $S_F$ provided to the signal combiner 35. An optional edge detector 50 is coupled to a clock input 41 of the signal quantizer 40 and to the resistive element 30 for detecting transitions in the capacitively-coupled signal $S_D$.

The capacitively-coupled signal $S_D$ corresponds to the input signal $S_I$ but with decaying intervals for respective DC voltage intervals of the input signal $S_I$ due to the high pass filtering of the filter 55. Also, the capacitively-coupled signal $S_D$ has voltage magnitudes that are substantially limited to within the operating voltages of the integrated circuit 1 as is described in detail below with regard to FIG. 2. In accordance with the invention, it is advantageous for the generated complimentary feedback signal $S_F$ to have a rate of change in magnitude substantially equal to the transient decay rate during each DC voltage interval of the signal $S_I$. Thus, when the signals $S_D$ and $S_F$ are combined by the signal quantizer 35, the resulting combined signal $S_C$ corresponds to the input signal $S_I$ substantially without decay and within the operating DC voltages of the integrated circuit 1.

However, the magnitude rates of change of the signals $S_O$ and $S_F$ need not be the same in accordance with the invention. The rate of change employed for the magnitude of the signal SF should be provided that produces a corresponding combined signal $S_C$ having a voltage magnitude that is detectable by the integrated circuit 1, or other integrated circuits coupled to that integrated circuit, for representing the proper logic state conveyed in the input signal $S_I$. Since the decay rate of the signal $S_D$ is based on the RC time constant of the high pass filter 55, it is possible to achieve the desired rate of change in the signal $S_F$ by employing the corresponding desired RC time constant for the LPF 45 as described in detail below with regard to FIG. 2. For instance, if the magnitude rates of change in the signals $S_D$ and $S_F$ are to be substantially the same to substantially eliminate the decay than the RC time constraints for the high pass filter 55 and the LPF 45 should be substantially the same.

Figure 2:
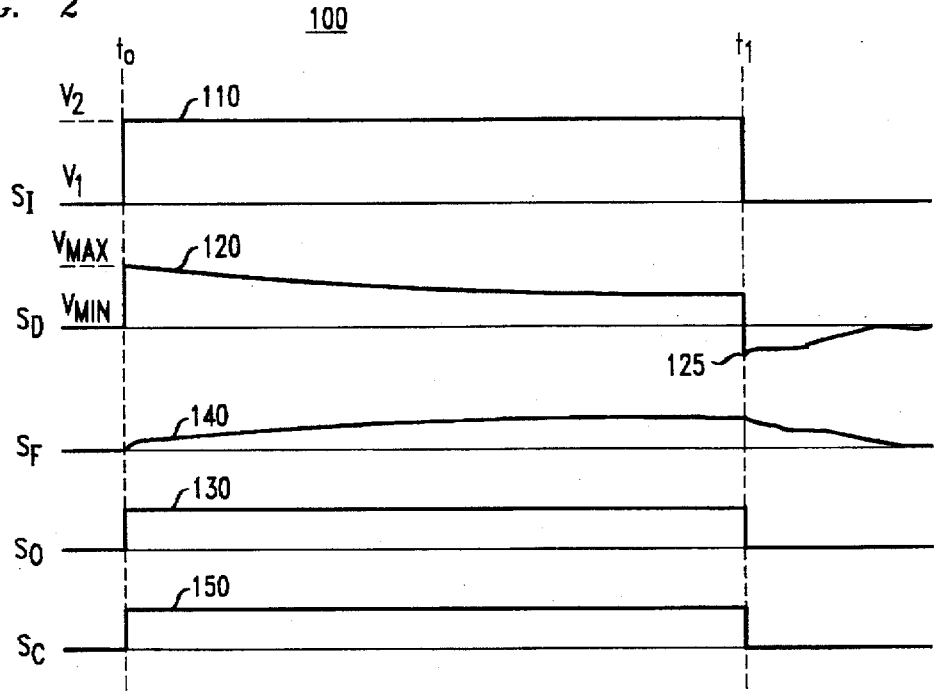
FIG. 2 illustrates an exemplary timing diagram showing the operation of the input section of FIG. 1.
Figure 4:
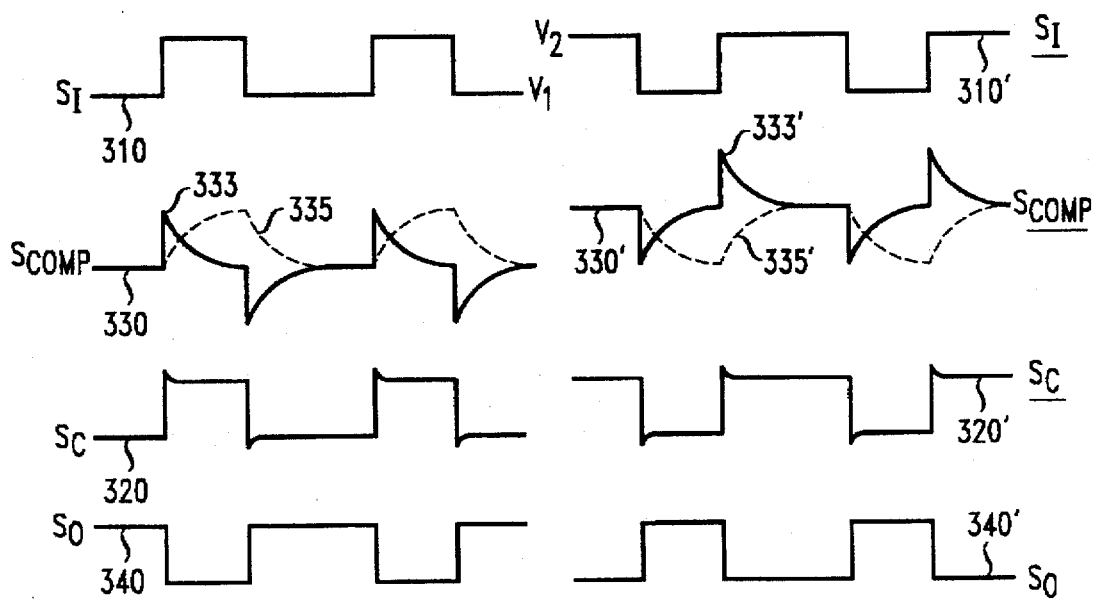
FIG. 4 illustrates an exemplary timing diagram showing the operation of the circuit of FIG. 3.

An exemplary timing diagram 100 illustrating the operation of the QFR 20 is shown in FIG. 2. The waveforms in FIG. 2 as well as FIG. 4 are depicted as ideal waveforms for ease of illustration and it should be readily understood that particular rise and fall times would exist for the voltages transitions, such as at time $T_O$ for the waveform 110 in FIG. 2. In FIG. 2, waveform 110 depicts the input signal $S_I$ representing a number of consecutive bits of the same particular logic state for a period between times $T_O$ and $T_I$ and consecutive bits of another logic state after $T_I$. Consecutive bits of the same logic state are typically represented in a communication signal as a corresponding interval of a particular DC voltage level, such as voltage level $V_1$ or $V_2$ in FIG. 2

A waveform 120 depicts the corresponding capacitively-coupled signal $S_D$ produced by the high pass filter 55. The waveform 120 and corresponding waveforms generated within the QFR 20 are substantially within the operating voltages $V_{MAX}$ and $V_{MIN}$ of the integrated circuit 1. The operating voltages $V_{MAX}$ and $V_{MIN}$ of the integrated circuit 1 can be different than the voltages magnitudes $V_1$ and $V_2$ of the input signal $S_I$ 110. The respective operating voltages $V_{MAX}$ and $V_{MIN}$ and $V_1$ and $V_2$ have not been drawn to scale in FIG. 2 and are not intended to be depicted as having similar operating DC voltages.

At the start of a DC voltage interval of input signal $S_I$ 110 such as at time $T_O$, the signal $S_D$ 120 has an initial voltage magnitude such as ($V_{MAX}$-$V_{MIN}$) that is substantially equal to the voltage magnitude achieved at the conclusion of a last voltage transition in the input signal $S_I$ 110 of ($|V_{MIN}$-$V_{MAX}|$) After starting at such a magnitude, the signal $S_D$ 120 then decays for a duration until a next transition is received in the signal $S_I$ 110, such as at time $T_I$. The signal $S_D$ 120 decays at a rate, typically an exponential rate, based on the RC time constant of the high pass filter 55. It is possible for the RC time constants for the CMOS QFR 20 to be in the range of, for example, approximately 4 to 10 nsec.

The time duration that the input signal $S_I$ 110 remains at a particular voltage level determines the extent of the decay in the corresponding signal $S_D$ 120. As a consequence, longer sequences of consecutive bits of the same logic state in the input signal $S_I$ 110 cause a corresponding greater decay in the signal $S_D$ 120 for those bits. Such decay, if uncorrected, can cause erroneous reading of the digital information contained in the signal $S_I$ by the integrated circuit 1.

The signal $S_D$ 120 is combined by the signal combiner 35 with the feedback signal $S_F$, shown as waveform 140 and described below, to form the combined signal $S_c$, shown as waveform 150. The combined signal $S_c$ 150 is provided to the signal quantizer 40. The signal quantizer 40 generates a quantized output signal $S_O$, shown as waveform 130, based on the signal $S_C$ 150. The output signal $S_O$ 130 is generated at a particular voltage, such as voltage $V_{MAX}$ or $V_{MIN}$, based on the signal $S_C$ at the time a signal pulse is received at its clock input 41.

It is possible to provide clock pulses to the signal quantizer clock input 41 in synchronization with the received bits in the input signal $S_I$. Such clock pulses can be generated within or external to the integrated circuit 1. After a clock pulse is received, the signal quantizer 40 continues to generate the output signal $S_O$ 130 at the particular voltage independent of any change in voltage of the quantizer input signal $S_C$ 150 until the next clock pulse is received at the clock input 41. In processing digital signals, it is possible to use a flip-flop or latch, such as a D-type flip-flop, for the signal quantizer 40.

The output signal $S_O$ 130 is provided to the LPF 45 which produces the corresponding feedback signal $S_F$ shown as waveform 140 in FIG. 2. When the signal $S_O$ is at substantially the voltage $V_{MAX}$ or the high logic state, such as between times $T_0$ and $T_1$, the LPF 45 produces the feedback signal $S_F$ 140 that increases in magnitude from a particular low voltage, such as $V_{MIN}$, at a particular rate determined by the RC time constant of the LPF 45. If the RC time constant of the LPF 45 is substantially equal to the RC time constant of the high pass filter 55, then the rate of increase in the signal $S_F$ 140 is substantially equal to the decay rate of the signal $S_D$ 120 as is shown in FIG. 2.

As a consequence, the combining of the signals $S_D$ 120 and $S_F$ 140 having magnitudes that are respectively decreasing and increasing at substantially the same rate forms the combined signal $S_C$, shown as waveform 150, with a substantially DC voltage magnitude during the interval between times $T_0$ and $T_1$. In other words, the combining of the feedback signal $S_F$ 140 with the decaying signal $S_D$ 120 effectively restores the voltage magnitude of the capacitively-coupled signal without substantial decay. Accordingly, the signal quantizer 40 generates the output signal $S_O$ 130 based on the combined signal $S_C$ 150. Although either signals $S_C$ 150 or $S_O$ 130 can be used for the output signal of the integrated circuit input section 5, it is advantageous to use the quantized signal $S_O$ 130 for such purposes because intervals of the signal $S_O$ 130 are forced or latched to respective DC voltage levels corresponding to logic states and are not subject to small variations that might occur as a result of combining the signals in forming the signal $S_C$ 150.

In a similar manner, after time $T_1$, which is the transition of the signal $S_D$ 120 from the high logic state or voltage $V_{MAX}$ to the low logic state or voltage $V_{MIN}$, the filtered signal $S_F$ 140 further compensates for the undershoot of the minimum operating voltage $V_{MIN}$ of the integrated circuit 1 that occurs at the voltage transition at time $T_1$. This compensation occurs because the low pass filter 45 generates the filtered signal $S_F$ 140 with a substantially opposite and equal rate of change than a change in the signal $S_D$ 120 caused by the high pass filter 55.

As is previously stated, it is possible to provide clock pulses to the signal quantizer clock input 41 in synchronization with the received bits in the input signal $S_I$ for maintaining the desired voltages for the output signal $S_O$. However, in accordance with a second aspect of the invention, an edge detector circuit, such as the edge detector 50 in FIG. 1, can be used to detect the voltage transitions in the input signal $S_I$ and provide corresponding pulses to the quantizer clock input 41, accordingly. The edge detector 50 provides efficient generation of clock pulses only for voltage transitions in the input signal $S_I$ and not for each data bit received in the input signal $S_I$ as is used in the previously described synchronous case. Thus, referring to FIG. 2, the edge detector 50 would only generate clock pulses for the respective transitions occurring at times $T_0$ and $T_1$ in the input signal $S_I$ 110 substantially independent of the number of consecutive bits of the same logic state. As a result, this configuration reduces the power consumed by the integrated circuit 1.

It should be readily understood that the function blocks depicted in the diagram of FIG. 1 can be performed by corresponding components or groups of components in an integrated circuit according to the invention. Further, in accordance with the invention, it is also possible to use components or groups of components that integrate the functions of two or more of such function blocks. For instance, an advantageous technique to provide substantially equal RC time constants for the LPF 45 and the high pass filter 55 is to use the same components to form both pass filters. Such a technique eliminates the requirement of matching capacitance and resistance values for the respective filters as well as reducing the area on the integrated circuit required by such filters. A CMOS circuit 200 that uses such a component arrangement and is capable of receiving a balanced input signal is shown in FIG. 3.

A balanced input signal includes a pair of signals $S_I$ and $\underline{S_I}$ that are 180° out of phase with one another. Balanced signals provide the advantage of high common mode noise rejection. As a consequence, balanced signals can substantially reduce the effects of inductive noise caused by a dynamic voltage difference between respective ground planes of a circuit assembly, such as a PWB, and an integrated circuit mounted thereto.

Figure 3:
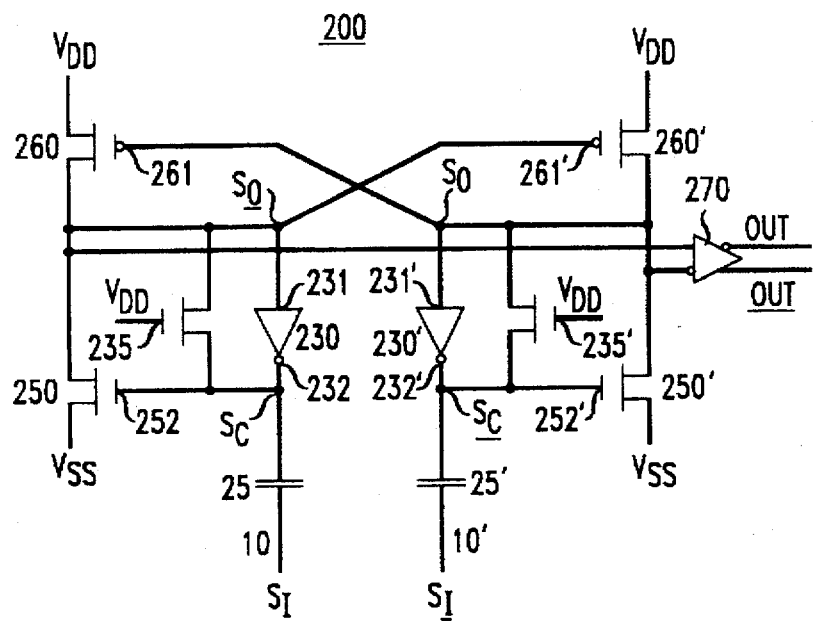
FIG. 3 illustrates an exemplary circuit diagram according to the block diagram of FIG. 1.

Similar components in FIGS. 1 and 3 are like numbered for clarity including the integrated circuit input 10 and the capacitor 25. Since the circuit 200 employs balanced signals, a differential input 10' and capacitor 25' are also provided for use with the differential input signal $\underline{S_I}$ in FIG. 3. The capacitance values of the capacitors 25 and 25' should be substantially similar so as not to cause the circuit 200 to generate differential output signals that will result in the detection of erroneous data bits. Inverters 230 and 230' having substantially similar output impedances correspond to the resistive element 30 of FIG. 1. Each inverter 230 and 230' has respective inputs 231 and 231' and outputs 232 and 232'.

Two transistors 235 and 235' are disposed in parallel across the respective inverters 230 and 230'. It is possible to employ transistors having relatively long channels for the transistors 235 and 235'. Each inverter output 232 and 232' is coupled to respective gates 252 and 252' of transistors 250 and 250'. Each of the transistors 250 and 250' is further coupled between the minimum operating voltage $V_{SS}$ for the integrated circuit 200 and the respective inverter inputs 231 and 231'. Respective transistors 260 and 260' are coupled between the inverter inputs 231 and 231' and a maximum operating voltage $V_{DD}$ of the integrated circuit 200. Gates 261 and 261' of the transistors 260 and 260' are cross-coupled to inverter inputs 231' and 231, respectively. The balanced output signals $S_O$ and $\underline{S_O}$ are produced at the respective inverter inputs 231 and 231' which are further coupled to a differential amplifier 270 that generates amplified balanced output signals OUT and $\underline{OUT}$.

The output resistances of the inverter outputs 232 and 232' and the capacitors 25 and 25' correspond to the resistive element 30 and capacitor 25 of the high pass filter 55 as well as the components of the LPF 45 in FIG. 1. In this manner, the capacitively-coupled signals produced by the high pass filters that correspond to the signal $S_D$ in FIG. 1 and the feedback signals produced by the low pass filters that correspond to the signal $S_F$ of FIG. 1 are part of the respective composite signals $S_C$ and $\underline{S_C}$ at the inverter outputs 232 and 232'. These composite signals $S_C$ and $\underline{S_C}$ correspond to the combined signal $S_C$ of FIG. 1.

Several other components in the integrated circuit 200 in FIG. 3 also advantageously perform two or more function blocks, i.e. integrate function blocks, in the QFR 20 block diagram in FIG. 1. For instance, the cross-coupled flip-flop-like structure of transistors 250 and 250' and 260 and 260' correspond to the edge detector 50 and signal quantizer 40 of FIG. 1. Also, the function of the signal combiner 35 in FIG. 1 is performed at the inverter outputs 232 and 232' in FIG. 3.

An exemplary timing diagram 300 illustrating the operation of the circuit 200 is shown in FIG. 4. In FIG. 4, waveforms 310 and 310' represent exemplary differential input signals $S_I$ and $\underline{S_I}$ include alternating sequences of consecutive data bits of particular logic states. It is possible for the voltage difference between the high and low logic states for the signals $S_I$ 310 and $\underline{S_I}$ 310' to be on the order of 700 mV. The high pass filters formed by the respective capacitors 25 and 25' and the output resistance of the inverters 230 and 230' produce corresponding decayed differential signals 333 and 333' based on the input signals $S_I$ and $\underline{S_I}$.

Since the components forming the high pass filters also form the low pass filters, the decaying signals produced by the high pass filters and the feedback signals produced by the low pass filter are included in the composite differential signals $S_C$ and $\underline{S_C}$, shown as waveforms 320 and 320'. However, the signal components that make up these composite differential signals $S_C$ 320 and $\underline{S_C}$ 320' are shown as superimposed waveforms 330 and 330' of signals $S_{COMP}$ and $\underline{S_{COMP}}$ in FIG. 4 for ease of understanding. The signal generated by the high pass filter configuration is shown as solid line waveforms 333 and 333' in the superimposed waveforms 330 and 330' and correspond to the signal $S_D$ in FIG. 2. Further, waveforms 335 and 335' in the superimposed waveforms 330 and 330' are shown with dashed lines and represent the differential feedback signals produced by the low pass filter configuration which correspond to the feedback signal $S_F$ in FIG. 2.

Since the same components are used for the high and low pass filters in the QFR circuit 200 in FIG. 3, the RC time constants are identical for these respective filters. Accordingly, the rate of change in magnitude of the feedback signals 335 and 335' is substantially equal and opposite to the decay rate of the waveforms 333 and 333'. As a consequence, the feedback signals 335 and 335' compensate and substantially eliminate the decaying portion of the signals produced by the high pass filter configuration to form the composite signals $S_C$ 320 and $\underline{S_C}$ 320' as shown in FIG. 4. It is possible for the voltage difference between the high and low voltage states of the composite signals $S_C$ 320 and $\underline{S_C}$ 320' for the CMOS QFR 200 in FIG. 3 to be on the order of 500 mV.

Referring again to FIG. 3, The differential output signals $S_O$ and $\underline{S_O}$, waveforms 340 and 340' in FIG. 4, are composite signals containing a positive feedback signal component that facilitates edge detection of the differential input signals $S_I$ 310 and $\underline{S_I}$ 310'. In addition, the cross-coupled circuit structure that produces the differential output signals $S_O$ 340 and $\underline{S_O}$ 340' has a latch-like configuration for forming a portion of the signal quantizer 40 of FIG. 1. Moreover, the inclusion of the transistors 250 and 260 in this cross-coupled structure also advantageously enables the amplification of the differential output signals $S_O$ 340 and $\underline{S_O}$ 340'. It is possible for the difference between the high and low logic states of the differential output signals $S_O$ 340 and $\underline{S_O}$ 340' to be on the order of 2.3 V. The differential output signals $S_O$ 340 and $\underline{S_O}$ 340' are then further amplified to the desired operating voltage levels by the amplifier 270 in FIG. 3 to produce an amplified output signal OUT and $\underline{OUT}$ that can be used by other sections of the integrated circuit 1 of FIG. 1 and/or other integrated circuits coupled to the integrated circuit 1.

Although several embodiments of the invention have been described in detail above, many modifications can be made without departing from the teaching thereof. All of such modifications are intended to be encompassed within the following claims. For instance, although the invention has been described with regard to processing digital signals it is also useful for processing analog signals to eliminate decay caused by a high pass filtering effect. Such an integrated circuit would employ a signal quantizer having a sufficient number of quantized output voltage levels to provide the desired output signal resolution. In addition, the clock input of such a quantizer should receive clock pulses at a rate of at least twice the anticipated highest frequency of the input signal. Moreover, although the previously described embodiments employed voltage signals, current signals can be used in an integrated circuit according to the invention.

The invention claimed is:

1. An electrical circuit comprising:
an integrated circuit having a capacitor coupled thereto for receiving an input signal, said integrated circuit comprising:
a resistive element coupled between said capacitor and AC ground;
a signal combiner coupled to said capacitor;
a signal quantizer having an input coupled to a signal combiner output;
a low pass filter having an input coupled to an output of said signal quantizer and an output coupled to said signal combiner; and
an edge detector coupled to said capacitor and having an output coupled to a clock input of said signal quantizer, wherein a signal is producable at said quantizer output representing an input signal substantially without decaying signal magnitude changes due to capacitive-coupling of said input signal by said capacitor.

2. The electrical circuit of claim 1 wherein said low pass filter and a high pass filter formed by said resistive element and said capacitor have substantially equal RC time constants.

3. The electrical circuit of claim 1 wherein the signal quantizer comprises a flip-flop.

4. The electrical circuit of claim 3 wherein said flip-flop is a D-type flip-flop.

5. The electrical circuit of claim 1 wherein the capacitor is disposed external to the integrated circuit.

6. The electrical circuit of claim 1 wherein the capacitor is located within the integrated circuit.

7. The electrical circuit of claim 1 wherein said resistive element comprises an input resistance of the integrated circuit.

8. An electrical circuit for receiving balanced input signals comprising:
an integrated circuit having first and second capacitors coupled thereto for receiving said balanced input signals, said integrated circuit comprising:
first and second resistive elements having respective first terminals coupled to said first and second capacitors;
first and second transistors coupled to each other at a first junction and in series between first and second voltage sources, said first junction further coupled to a second terminal of said first resistive element, said first transistor further having a gate coupled to a second terminal of said second resistive element; and
third and fourth transistors coupled to-each other at a second junction, and in series between said first and second voltage sources, said second junction further coupled to said second terminal of said second resistive element, said third transistor further having a gate coupled to said second terminal of said first resistive element, said second and fourth transistors further having gates coupled to said respective first terminals of said first and second resistive elements, wherein balanced output signals are generated at said second terminals of said first and second resistive elements representing said input signals substantially without decaying signal magnitude changes due to capacitive-coupling of said balanced input signals by said first and second capacitors.

9. The electrical circuit of claim 8 wherein said first and second resistive elements comprise first and second biased inverters.

10. The electrical circuit of claim 9 wherein said first and second inverters are biased by fifth and sixth transistors connected in parallel with said first and second inverters.

11. The electrical circuit of claim 8 wherein said first and second capacitors are formed on said integrated circuit.

12. The electrical circuit of claim 8 wherein said first and second capacitors are located external to said integrated circuit.

* * * * *